(12) United States Patent
Zundel et al.

(10) Patent No.: US 7,645,690 B2
(45) Date of Patent: Jan. 12, 2010

(54) METHOD FOR PRODUCING AN INTEGRATED CIRCUIT HAVING SEMICONDUCTOR ZONES WITH A STEEP DOPING PROFILE

(75) Inventors: Markus Zundel, Egmating (DE); Hans-Joachim Schulze, Ottobrunn (DE); Frank Hille, Munich (DE)

(73) Assignee: Infineon Technologies Austria AG, Villach (AT)

( * ) Notice: Subject to any disclaimer, the term of this patent is extended or adjusted under 35 U.S.C. 154(b) by 412 days.

(21) Appl. No.: 11/675,376

(22) Filed: Feb. 15, 2007

(65) Prior Publication Data

US 2008/0044988 A1 Feb. 21, 2008

(30) Foreign Application Priority Data

Feb. 15, 2006 (DE) .................. 10 2006 007 052

(51) Int. Cl.
*H01L 21/425* (2006.01)
(52) U.S. Cl. .............................. 438/514; 257/E21.473; 257/E21.249
(58) Field of Classification Search ................. 438/514; 257/E21.249, E21.473
See application file for complete search history.

(56) References Cited

U.S. PATENT DOCUMENTS

| | | | | |
|---|---|---|---|---|
| 4,243,433 A | * | 1/1981 | Gibbons | 438/528 |
| 4,339,285 A | | 7/1982 | Pankove | |
| 4,835,118 A | * | 5/1989 | Jones et al. | 438/131 |
| 5,420,454 A | * | 5/1995 | Vook et al. | 257/518 |
| 5,937,297 A | | 8/1999 | Peidous | |
| 6,258,661 B1 | * | 7/2001 | Furukawa et al. | 438/249 |
| 6,291,302 B1 | | 9/2001 | Yu | |
| 6,297,117 B1 | | 10/2001 | Yu | |
| 2002/0192914 A1 | | 12/2002 | Kizilyalli et al. | |
| 2004/0245583 A1 | | 12/2004 | Horiuchi et al. | |

\* cited by examiner

*Primary Examiner*—David S Blum
(74) *Attorney, Agent, or Firm*—Dicke, Billig & Czaja, PLLC (57) ABSTRACT

An integrated circuit and method, producing semiconductor zones with a steep doping profile is disclosed. In one embodiment, dopants are implanted in a region corresponding to the semiconductor zone to be formed and which has at least one topology process. During the subsequent laser irradiation for activating the dopants in the semiconductor zone, regions which are laterally directly adjacent to the semiconductor zone are protected against melting on account of the topology process.

25 Claims, 11 Drawing Sheets

METHOD FOR PRODUCING AN INTEGRATED CIRCUIT HAVING SEMICONDUCTOR ZONES WITH A STEEP DOPING PROFILE

CROSS-REFERENCE TO RELATED APPLICATIONS

This Utility Patent Application claims priority to German Patent Application No. DE 10 2006 007 052.6 filed on Feb. 15, 2006, which is incorporated herein by reference.

BACKGROUND

The miniaturization of semiconductor components is accorded a preeminent importance in the development of new generations of semiconductor technologies. By shrinking the dimensions of the semiconductor components, it is possible to increase the integration density on a semiconductor chip and thus to achieve a cost saving as an important development goal. However, shrinking the component dimensions requires dopant profiles which can be produced ever more steeply and in ever more sharply delimited fashion. Particularly for contact regions which, on the one hand, are intended to have extremely high dopant concentrations in order to obtain a low-value contact resistance, but on the other hand must not influence the functionality of the more lightly doped wells situated directly in their vicinity, it is desirable to produce dopant profiles which fall steeply.

One method for producing such dopant profiles is laser annealing in the melt mode. In this case, by way of example, the energy density of an individual light pulse is chosen to be high enough, for instance by focusing that the wafer is melted near the surface. On account of this, previously implanted dopants are dissolved in the melt and incorporated at lattice sites during the recrystallization. A degree of activation of the dopants of up to 100% is obtained in this case. Since the pulse duration is very short, lasting e.g., a few nanoseconds, and only an individual pulse is required for melting the wafer near the surface, an outdiffusion of the dopants is negligibly small in comparison with other methods. Aside from the lower degree of outdiffusion, shorter process durations are obtained with laser annealing in the melt mode in comparison with other methods. Thus, by way of example, an individual pulse during laser annealing in the melt mode may be sufficient for activating the dopants.

During laser annealing in the melt mode, a semiconductor body below a semiconductor body/oxide layer interface that is possibly present is also melted, whereas the oxide does not melt. The subsequent recrystallization leads to thermomechanical strains in the region of the interface. This has undesirable consequences, such as cracking and delamination of the oxide. Consequently, during laser annealing in the melt mode, care must be taken to ensure that oxide-covered regions of the semiconductor body are not exposed to the laser light during annealing. Accordingly, masking is necessary during the annealing.

U.S. Pat. No. 6,291,302 describes a method for producing a field effect transistor that includes depositing a material that reflects laser light onto a substrate having an active region and a non-active region. In this case, regions of the deposited layer above the active region are removed and dopants within the active region are activated by laser annealing. The masking for the laser annealing is removed again after the annealing.

A simplified method for producing semiconductor zones with a steep doping profile would be desirable.

For these and other reasons, there is a need for the present invention.

SUMMARY

One embodiment provides a method of producing an integrated circuit having a semiconductor body with dopants implanted into at least one partial region of the semiconductor body uncovered at a lower region of a topology process. The semiconductor body is irradiated to activate the dopants, including protecting region laterally directly adjacent to the partial region. The partial region is recrystallized, to provide a semiconductor zone having a steep doping profile.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
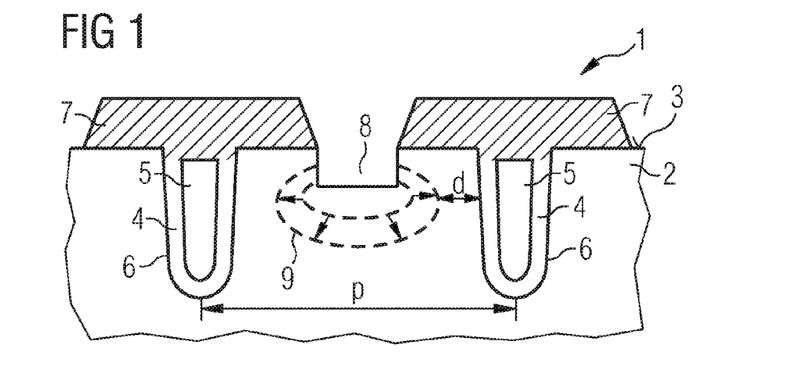
FIG. 1 illustrates a schematic cross-sectional view of a trench contact connection zone of a known trench MOSFET.

FIG. 1 illustrates a schematic cross-sectional view of a transistor cell of a MOSFET having trench electrode and trench contact. For the sake of clarity, the illustration of all of the semiconductor zones that have already been formed is dispensed with, only regions that serve for understanding the invention being illustrated. A semiconductor substrate 1 has a semiconductor body 2, from the surface 3 of which first trenches 6 that have already been filled with an insulation structure 4 and an electrode structure 5 project into the semiconductor body 2. In a mesa region between adjacent first trenches 6, a further trench 8 serving as a contact trench is introduced into the semiconductor body 2 by a patterned mask 7 formed on the surface 3 of the semiconductor body 2. A contact connection zone 9 is formed by implantation of corresponding dopants via the masked surface 3 with a known heat treatment process, e.g., RTA (Rapid Thermal Annealing) for activating the dopants. However, the heat treatment also leads to the lateral outdiffusion of the dopants. In order to ensure the desired electrical properties of the transistor, a critical distance d between the contact connection zone 9 and the first trenches 6 must not be undershot. Accordingly, in the case of customary thermal activation of the dopants (e.g., by RTA), the formation of the contact connection zone 9, on account of the outdiffusion of the dopants thereof (identified schematically by arrows in FIG. 1), limits a miniaturization of the mesa region and thus a pitch P of adjacent first trenches 6.

In one embodiment, a method for producing an integrated circuit having semiconductor zones with a steep doping profile is specified. The method includes providing a preprocessed semiconductor substrate, wherein the semiconductor substrate has a semiconductor body and also at least one topology process at a surface of the semiconductor substrate. Dopants are implanted into at least one partial region of the semiconductor body that is uncovered in the lower region of the topology process. The semiconductor body is irradiated with laser radiation in order to activate the dopants by melting at least the partial region of the semiconductor body, wherein the partial region recrystallizes, The topology process is maintained in respect of its structural composition during subsequent processes of the semiconductor substrate.

Consequently, the topology process on the one hand serves for protecting those regions of the semiconductor body which are laterally adjacent to the partial region against melting, and on the other hand constitutes part of a semiconductor IC (IC: Integrated Circuit) to be formed during further processes, since the topology process is maintained in respect of its structural composition, that is to say the materials forming it are maintained. A sacrificial reflection structure to be provided specially for the laser annealing, for instance, is not required.

The preprocessed semiconductor substrate may be, for example a semiconductor body of a semiconductor material such as, for instance silicon, a III-V semiconductor material such as, for instance gallium arsenide or else further semiconductor materials such as, for instance, SiGe or SiC. The preprocessed semiconductor substrate may contain, for instance, trenches formed within the semiconductor body for, e.g., trench capacitors or else trench MOSFETs (Metal Oxide Semiconductor Field Effect Transistor). Semiconductor zones for the definition of semiconductor components such as, for instance, MOSFETs, bipolar transistors, diodes, resistances or else capacitances may likewise already be formed within the semiconductor body. Moreover, the semiconductor substrate may have layers, such as insulation layers, for instance, formed above the semiconductor body.

In one embodiment, the at least one topology process at the surface of the semiconductor substrate is provided through an opening in a layer stack formed on the semiconductor body, wherein the opening reaches as far as the surface of the semiconductor body. Consequently, the semiconductor body is masked outside the opening by the layer stack and the laser radiation activates only dopants implanted in the uncovered partial region of the semiconductor body.

In another embodiment, the opening projects into the semiconductor body. This makes it possible to realize a trench contact-connection, by way of example, wherein the dopants implanted into the partial region of the semiconductor body via the bottom region of the opening are introduced in high concentration in order to obtain a low-value contact resistance with respect to a contact material. Concentrations of above approximately $10^{19}$ cm$^{-3}$ serve as a high concentration of activated dopants.

In one embodiment, the layer stack includes at least an insulation structure formed on the surface of the semiconductor body and an absorption structure formed on the insulation structure, wherein the absorption structure absorbs the laser radiation during the laser annealing. The absorption structure accordingly serves as a mask and protects the vertically underlying regions of the semiconductor body against being melted during the laser annealing. Consequently, only the semiconductor body in the lower region of the topology process is melted and recrystallized for the activation of the dopants in the first partial region. The layer stack is maintained after the laser annealing and is therefore part of a semiconductor chip to be formed in the further process. By way of example, the insulation structure may be utilized for insulating the semiconductor body from metallization levels.

In accordance with another embodiment the insulation structure is formed as an oxide structure and/or a nitride structure of the silicon and the absorption structure is formed from polysilicon. The semiconductor body is formed from silicon in this example. Polysilicon is a conventional material in semiconductor technologies and, consequently, complicated integration of new materials, for instance for forming sacrificial reflection layers, is not required for carrying out the laser annealing in the melt mode.

By way of example, the absorption structure is formed from polysilicon having a thickness within the range of 100 to 500 nm. Polysilicon structures in this thickness range are suitable for complete absorption of the laser light during annealing and thus for protection of the underlying semiconductor body against melting.

The layer stack may be removed again in the processes outside a region of influence of the topology process. Accordingly, the layer stack and hence the topology process are maintained. Those regions of the layer stack which can be removed without changing the topology process therefore lie outside the region of influence. By way of example, the layer stack may be removed in an edge region of the semiconductor IC to be formed. It is likewise possible, during the patterning of a metallization level which makes electrical contact with the trench forming the topology process, correspondingly to concomitantly remove the absorption structure of the layer stack as well. The topology process is maintained, however, in the process. Short circuits between adjacent interconnects that are attributable to the absorption structure can be avoided in this way.

By way of example, the at least one topology process at the surface of the semiconductor body is provided through a trench formed in the semiconductor body. Consequently, the semiconductor body defines both an upper region of the topology process and a lower region of the topology process. During the laser annealing, the semiconductor body is consequently melted and recrystallized in the upper and in the lower region of the topology process.

Moreover, before the at least one topology process is provided, further dopants can be implanted into the semiconductor body, with the result that further dopants are introduced into the semiconductor body in the region of the topology process to be formed and in a manner at least partly adjacent therefrom. Consequently, the further dopants can be activated after the provision of the topology process and implantation into the partial region by the laser annealing which is then effected. In this case, by way of example, the further dopants would be removed again locally during the formation of the topology process, so that they are maintained only adjacent to the topology process, but in addition dopants are implanted into the uncovered partial region in the lower region of the topology process. The laser annealing in the melt mode therefore leads to the activation of further dopants and of the dopants in the partial region of the semiconductor body in the lower region of the topology process. In this way, it is possible, for instance, firstly to implant the further dopants for the formation of a source region, to etch the topology process for the formation of a trench contact and then to implant the dopants into the uncovered partial region in the lower region of the topology process. After removal of an implantation/etching mask, the laser annealing in the melt mode leads to the formation of a source region with a steep doping profile and of a contact connection region formed in the partial region of the semiconductor body in the lower region of the topology process, the entire surface of the semiconductor body being exposed to the laser radiation.

As an alternative to this, it is possible for the further dopants to be activated by irradiating the semiconductor body with laser radiation before the at least one topology process is provided. Such an activation is conceivable both by laser annealing in the melt mode and in the non-melt mode.

In one embodiment, for producing a contact trench, a trench forming the topology process is filled with a conductive material. In this case, the conductive material can produce an ohmic contact to further semiconductor zones, for instance also via the sidewalls of the trench.

In accordance with another embodiment for producing a buried conductive layer for a topology process formed as a trench in the semiconductor body, after the irradiation with laser radiation, an oxide structure is formed within the trench and a contact structure is produced within the trench for making contact with the buried conductive layer.

Further conductive materials which are electrically insulated from the buried conductive layer are formed within the trench. Polysilicon may be involved in this case, by way of example, which acts as a gate electrode of trench MOSFETs.

In another embodiment, the laser irradiation is effected by a laser pulse whose absorption, in the semiconductor substrate results in the depositing of an energy density within the range of 1 to a few tens of $J/cm^2$. By way of example, melting depths of a few hundreds of nm can be achieved using an excimer laser having the wavelength $\lambda=307$ nm with a pulse duration of a few hundreds of ns and an energy density in the region of a few $J/cm^2$. A pulse duration within the order of magnitude range of a few ns to a few hundreds of ns is used. By the variation of pulse duration, wavelength, that is to say penetration depth of the laser radiation, deposited energy density and focusing of the laser beam, the melting depth can be set in a manner corresponding to the requirements.

By increasing the energy density, laser wavelength and pulse duration it is possible for the melting depth to tend to increase, by way of example.

A further embodiment specifies a semiconductor zone with a steep dopant profile in the bottom region of a trench representing a topology process in a semiconductor body, wherein the dopant profile falls by three orders of magnitude proceeding from a maximum value of the dopant concentration in the semiconductor zone after a distance of less than 50 nm.

It is favorable if the distance is less than 25 nm.

Figure 2A:
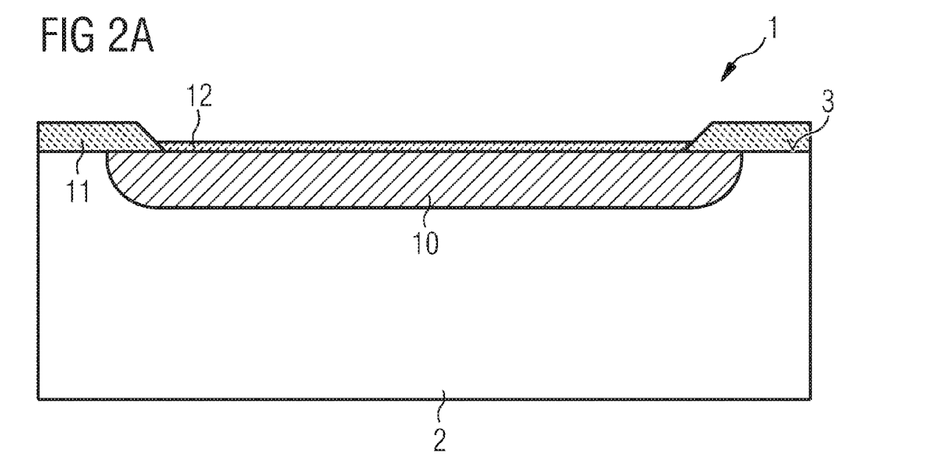
FIGS. 2A-2G illustrate schematic cross-sectional views of successive process stages for producing a contact connection zone in accordance with one embodiment of the invention.

FIG. 2A illustrates a schematic cross-sectional view at the start of a process chain for forming a contact connection zone in accordance with one embodiment of the invention. The preprocessed semiconductor substrate 1 has the semiconductor body 2, inter alia, in which a well zone 10 reaching as far as the surface 3 of the semiconductor body 2 has already been formed, which well zone is intended to be contact-connected via the surface 3. Both a thick oxide structure 11 and a thin oxide structure 12 lying on the well zone 10 are formed on the surface 3 of the semiconductor body 2.

Figure 2B:
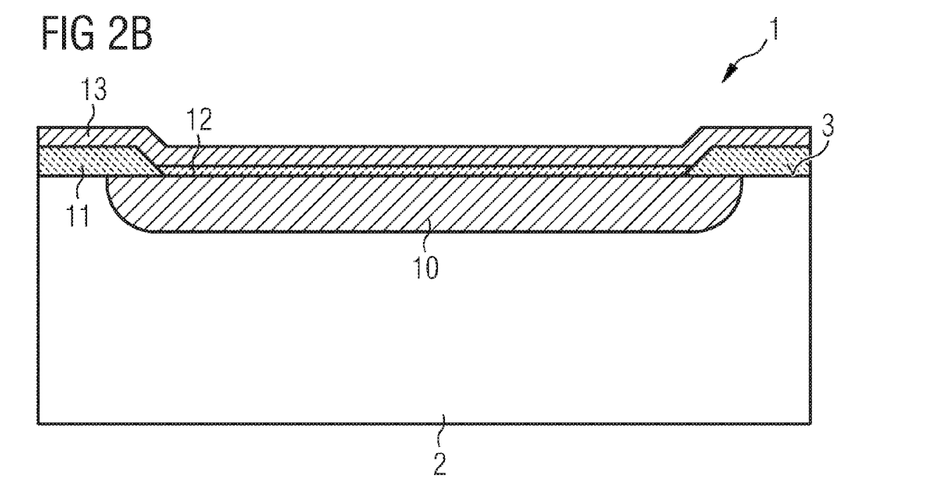

In the cross-sectional view of a process stage that is illustrated schematically in FIG. 2B, a polysilicon layer 13 is produced on the oxide structures 11, 12.

Figure 2C:
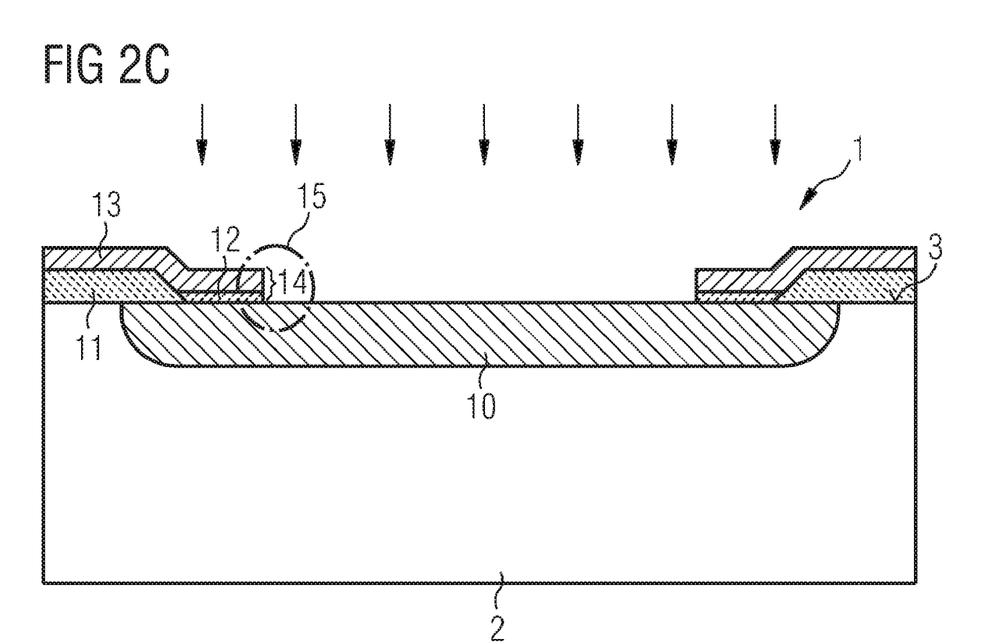

In the process stage illustrated as a schematic cross-sectional view in FIG. 2C, the opening of the layer stack 14 having the thin oxide structure 12 and the polysilicon layer 13 is followed by an implantation of dopants in order to form the contact connection zone. The opening of the layer stack 14 results in the formation of a topology process 15 between the surface 3 of the semiconductor body 2 and a surface of the polysilicon layer 13.

Figure 2D:
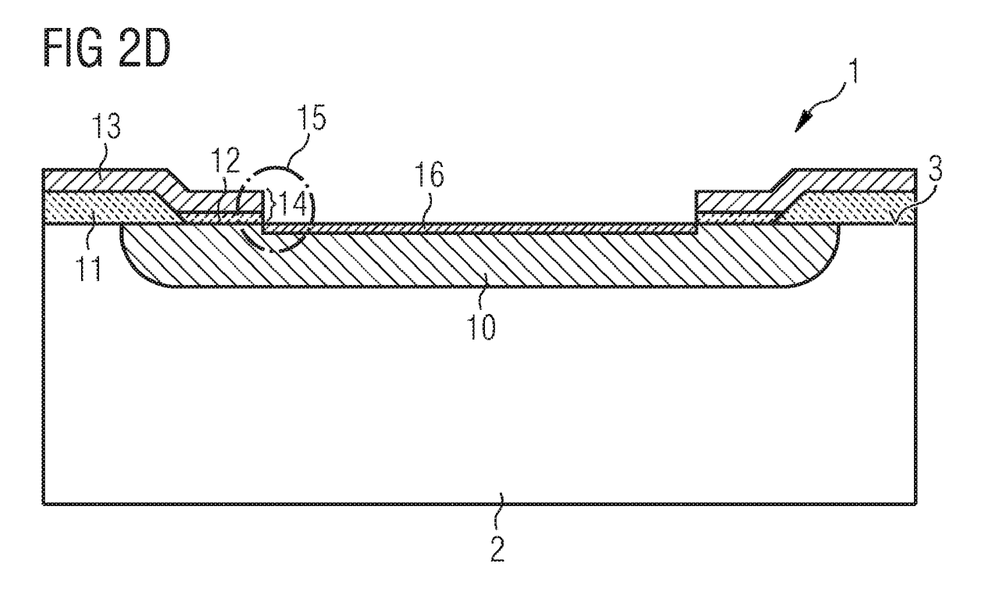

In the schematic cross-sectional view illustrated in FIG. 2D, the implanted dopants are emphasized as region 16 at the surface 3 of the semiconductor body 2.

Figure 2E:
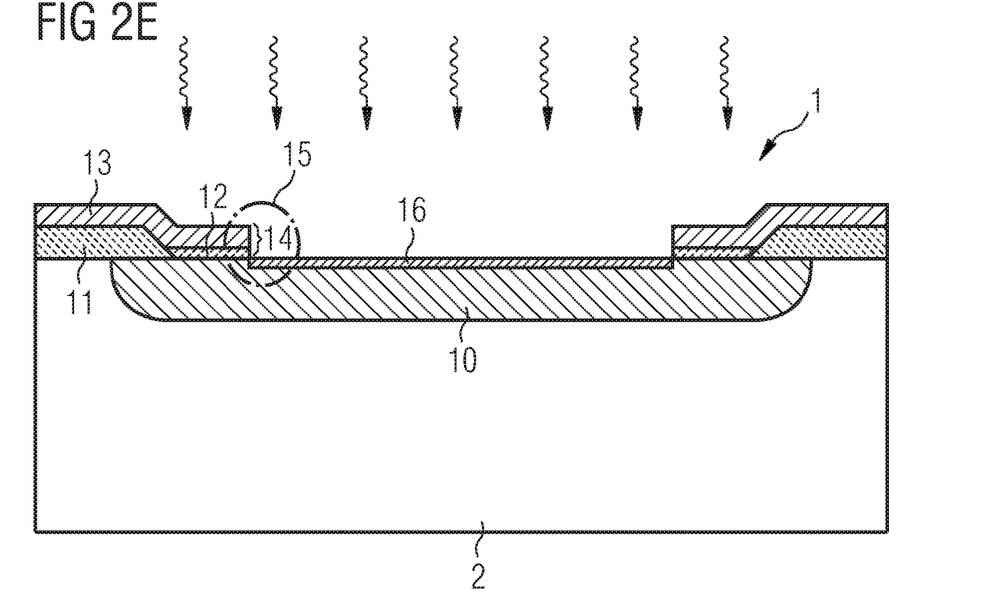

In the process stage schematically outlined as a cross-sectional view in FIG. 2E, the laser annealing in the melt mode is effected by irradiating the semiconductor substrate 1 with laser light. In this process, the dopants implanted into the region 16 are activated by melting and recrystallization of the region 16 and a steep dopant profile is formed in this case, in which the dopant concentration falls by two or more orders of magnitude within a few nm. The well zone formed thereby serves as a contact connection zone 9 for the well zone 10.

Figure 2F:
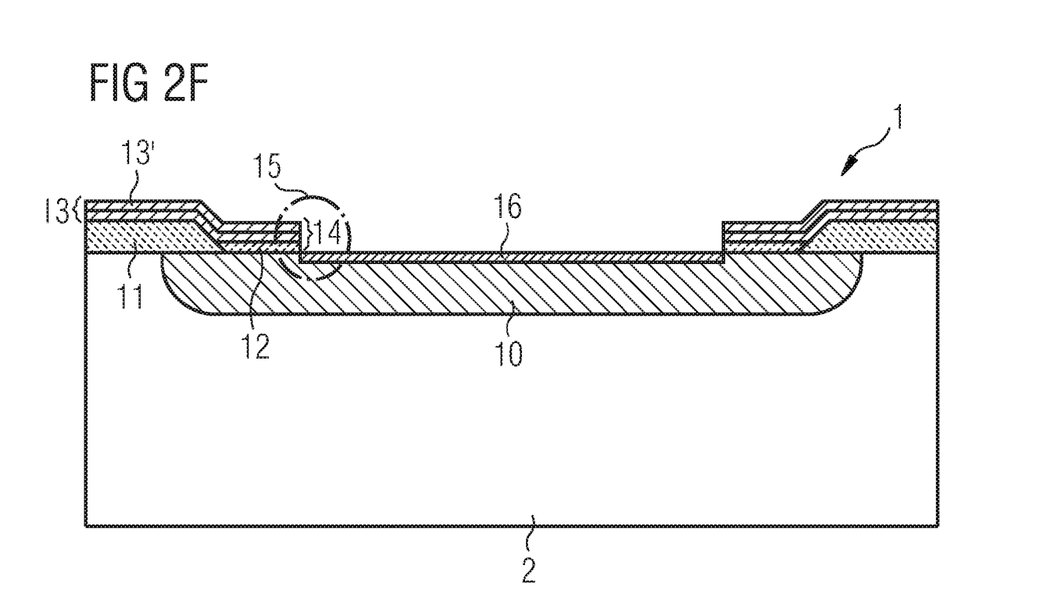

A surface region 13' of the polysilicon layer 13 is likewise melted during the laser annealing which is illustrated in the schematic cross-sectional view in FIG. 2F. The thickness of the polysilicon layer 13 is chosen such that the laser radiation is completely absorbed by it and no laser radiation passes into the underlying oxide structure 11, 12 and from there into the semiconductor body 2.

Figure 2G:
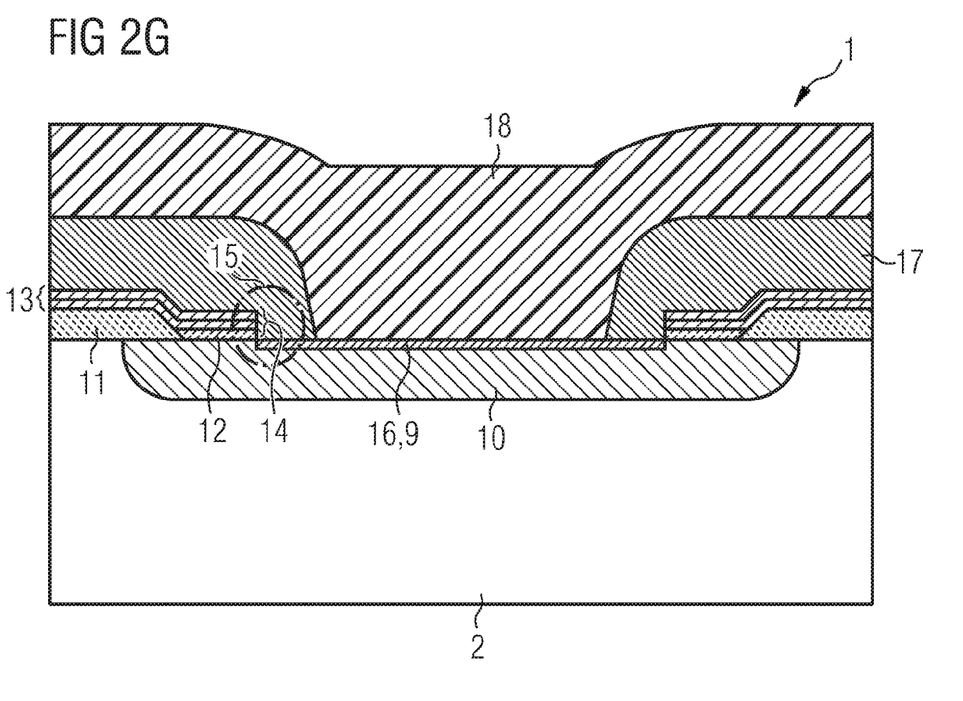

The topology process 15 and therefore the layer stack 14 is maintained in the process stages, in which case an intermediate oxide 17, and, via an opening in the intermediate oxide 17, a contact-connection of the well zone 10 by a metal structure 18 are formed in the schematic cross-sectional view of a process stage as illustrated in FIG. 2G.

Figure 3A:
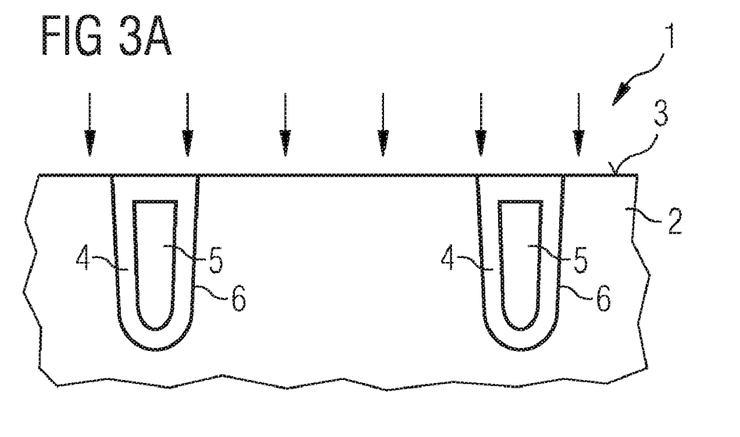
FIGS. 3A-3F illustrate schematic cross-sectional views of successive process stages for producing source regions and also a trench contact connection zone of a trench MOSFET in accordance with a further embodiment of the invention.

FIG. 3A illustrates a schematic cross-sectional view at the start of a process chain for forming a trench contact connection zone and source zones for a trench MOSFET in accordance with a further embodiment of the invention. Firstly, referring to the schematic cross-sectional view in FIG. 3A, an implantation into a preprocessed semiconductor substrate 1 is carried out, the semiconductor substrate 1 having, inter alia, first trenches 6 with insulation structure 4 and electrode structure 5 formed therein.

Figure 3B:
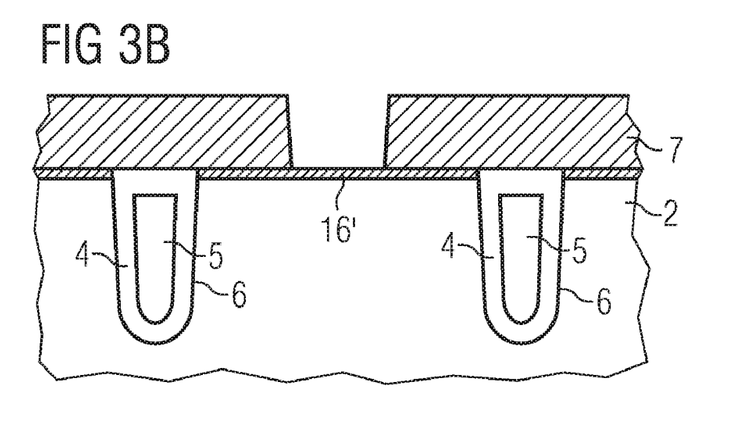

The implantation serves for introducing first dopants into the region 16' illustrated in FIG. 3B, the first dopants being provided for the formation of a source zone. In the process stage illustrated in this cross-sectional view, the patterned mask 7 is applied to the surface 3 of the semiconductor body 2, which serves as a mask for a trench etch and implantation.

Figure 3C:
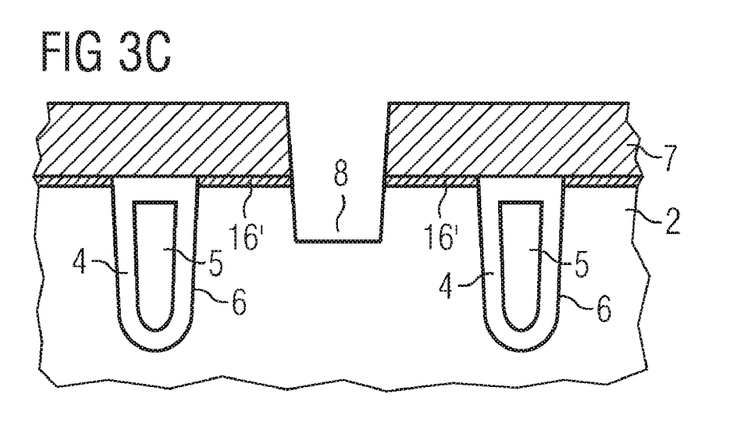

In the process stage illustrated schematically in FIG. 3C, a further trench 8 serving as a contact trench is etched into the semiconductor body 2. The dopants already implanted in this region are removed again in this case.

Figure 3D:
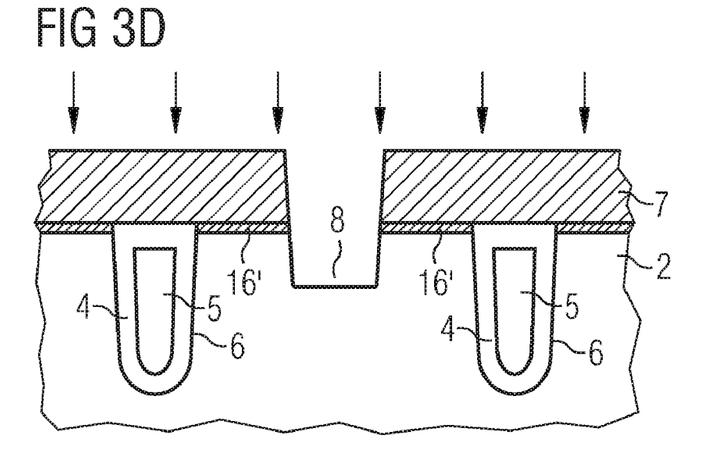

In the process stage illustrated as a schematic cross-sectional view in FIG. 3D, a further implantation of dopants is effected, the dopants serving to form a contact connection zone. The implantation is effected into a bottom region of the contact trench 8 and adjacent regions of the semiconductor body 2 are protected by the patterned mask 7.

Figure 3E:
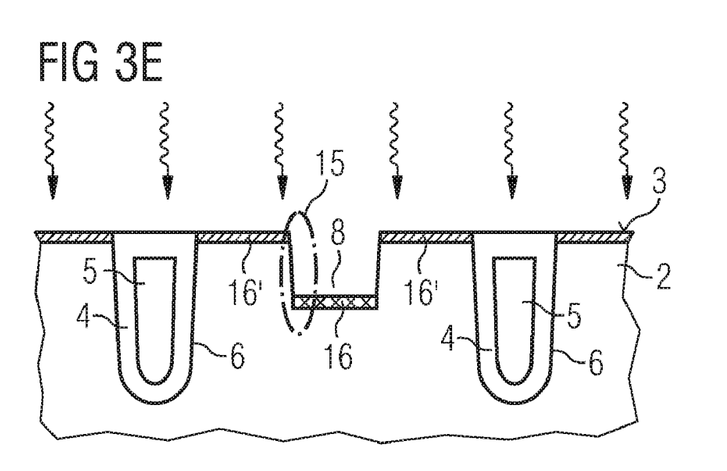
Figure 3F:
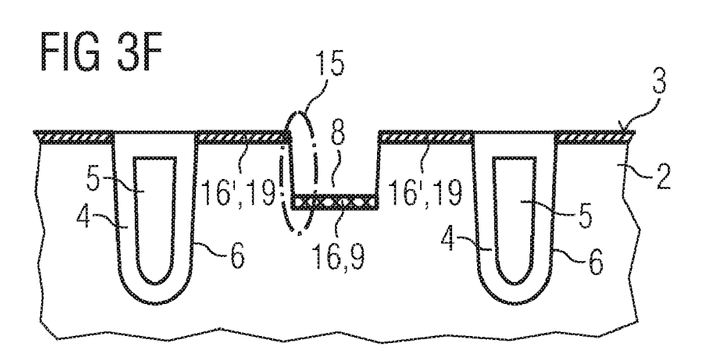

In the schematic cross-sectional view illustrated in FIG. 3E, the patterned mask 7 has been removed again, so that the regions 16, 16' implanted with dopants are uncovered. Via the contact trench 8, the topology process 5 is formed solely in the semiconductor body 2. The laser annealing in the melt mode thus serves both for activating the dopants in the region 16' and for activating the dopants in the bottom region 16 of the contact trench 8 and thus for activating the dopants that form a source zone 19 and the contact connection zone 9, see FIG. 3F. The topology process 15 is also maintained during processes for completing the trench MOSFET and is part of the component to be formed. In this embodiment, by the topology process 15, on the one hand, that part of the semiconductor body which is laterally directly adjacent to the region 16 is protected against melting, but in a manner the dopants of the regions 16, 16' that are to be attributed to different implantations are simultaneously activated jointly in an annealing process.

Figure 4A:
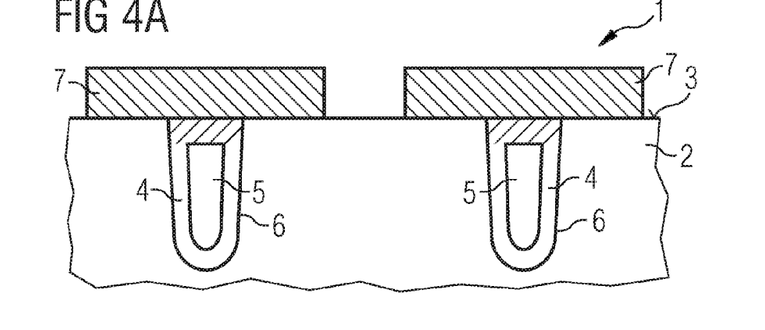
FIGS. 4A-4D illustrate schematic cross-sectional views of successive process stages for producing a trench contact connection zone of a trench MOSFET in accordance with a further embodiment of the invention.

FIG. 4A illustrates a schematic cross-sectional view at the start of a process chain for forming a trench contact connection zone for a trench MOSFET in accordance with a further embodiment of the invention. Firstly, referring to the schematic cross-sectional view in FIG. 4A, the patterned mask 7 is produced on the surface 3 of the semiconductor body 2. As in the previous embodiments, the preprocessed semiconductor substrate 1 has first trenches 6 with insulation structure 4 and electrode structure 5 formed therein.

Figure 4B:
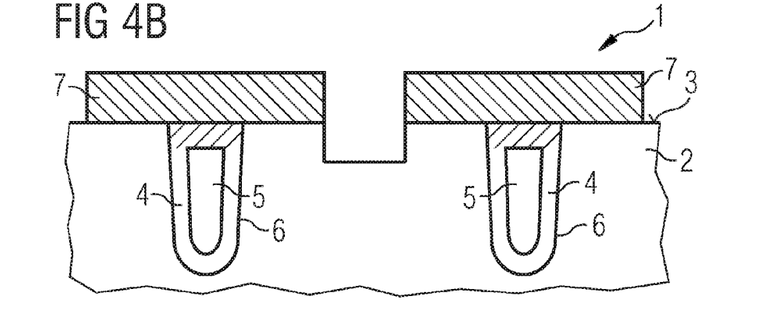

In the cross-sectional view of a process stage as illustrated in FIG. 4B, the contact trench 8 is etched into the semiconductor body 2 by the patterned mask 7 via the openings thereof.

Figure 4C:
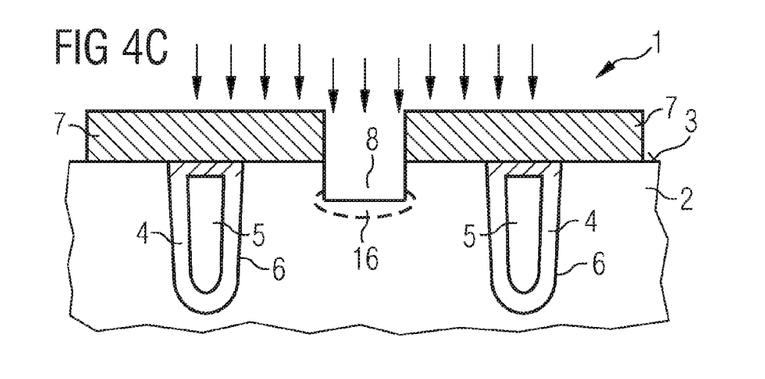

In the process stage illustrated as a schematic cross-sectional view in FIG. 4C, dopants are implanted into the region 16 at the bottom of the contact trench 8, the dopants serving to form a contact connection zone.

Figure 4D:
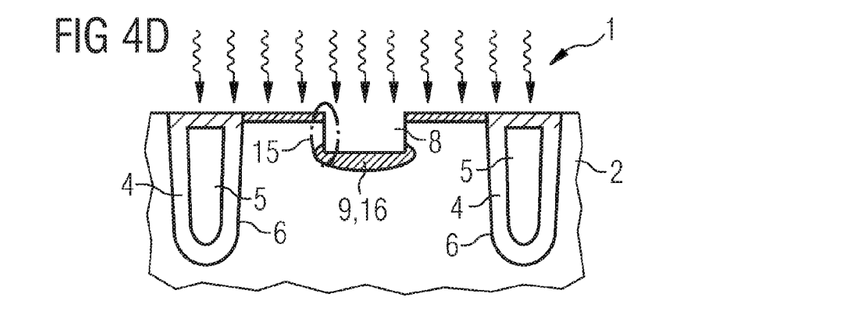

Then, as is illustrated in the schematic cross-sectional view in FIG. 4D, the patterned mask 7 is removed again, with the result that the topology process 15 formed through the trench 8 solely in the semiconductor body 2 remains. The laser annealing in the melt mode then leads to the activation of the dopants in the region 16 and thus to the formation of the contact connection zone 9. A lateral outdiffusion of the dopants is suppressed by the melting and recrystallization operation proceeding in the time range of ns during the melt-mode laser annealing. Besides the melting of the region 16 of the contact connection zone 9, in addition a region of the semiconductor body near the surface is melted and recrystallized, the region near the surface serving for the later formation of the source zone by further implantations.

Figure 5A:
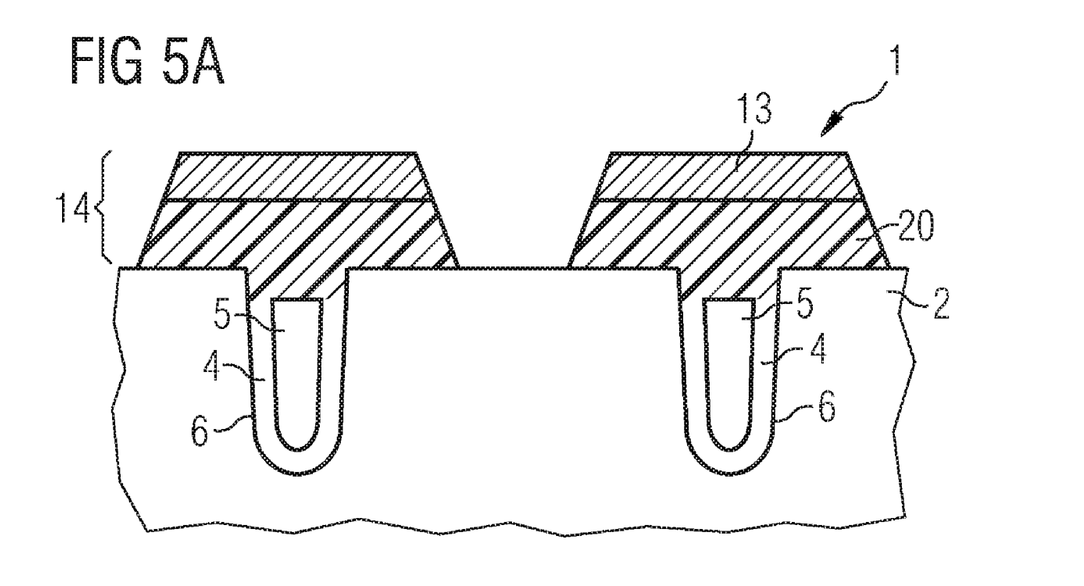
FIGS. 5A-5D illustrate schematic cross-sectional views of successive process stages for producing a trench contact connection zone of a trench MOSFET in accordance with a further embodiment of the invention.

FIG. 5A illustrates a schematic cross-sectional view at the start of a process chain for forming a trench contact connection zone for a trench MOSFET in accordance with a further embodiment of the invention. Firstly, referring to the schematic cross-sectional view in FIG. 5A, the layer stack 14 is produced on the surface of the semiconductor body 3 and patterned. The layer stack has an insulation structure 20, e.g., $SiO_2$, and also a polysilicon layer 13 formed thereon.

Figure 5B:
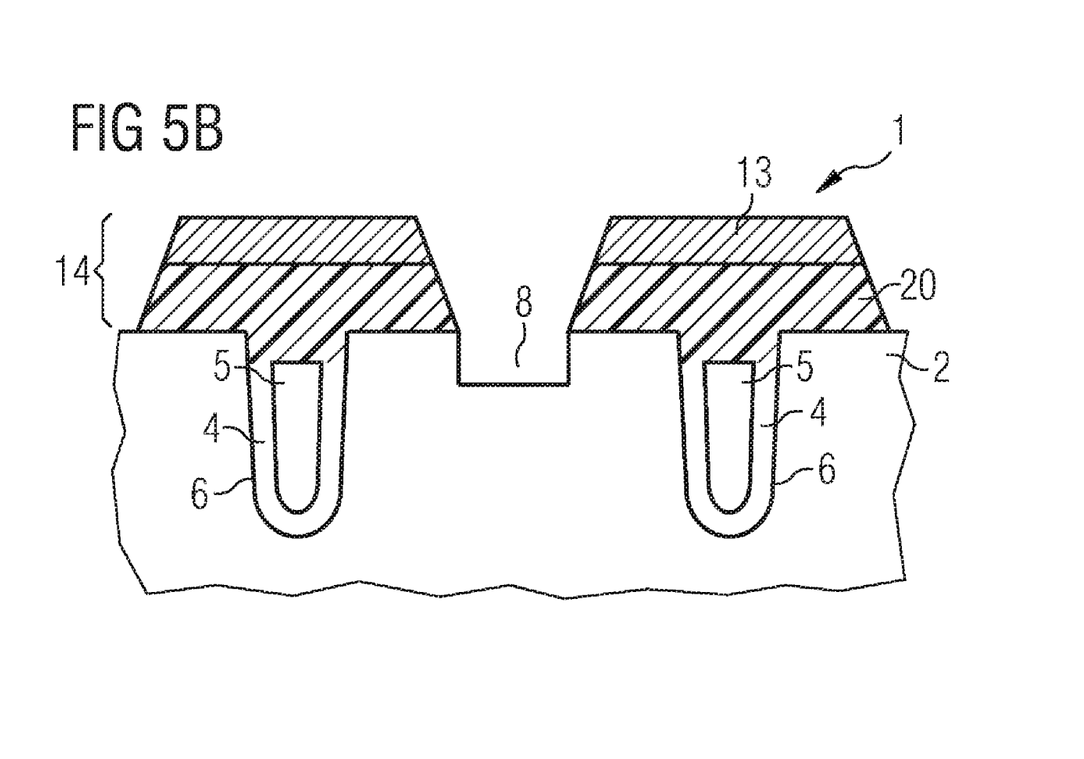

Via the opening in the patterned layer stack 14, as illustrated in FIG. 5B, a contact trench 8 is etched into the semiconductor body 2, the layer stack 14 protecting regions of the semiconductor body 2 that lie outside the contact trench 8 against an attack by the etching operation.

Figure 5C:
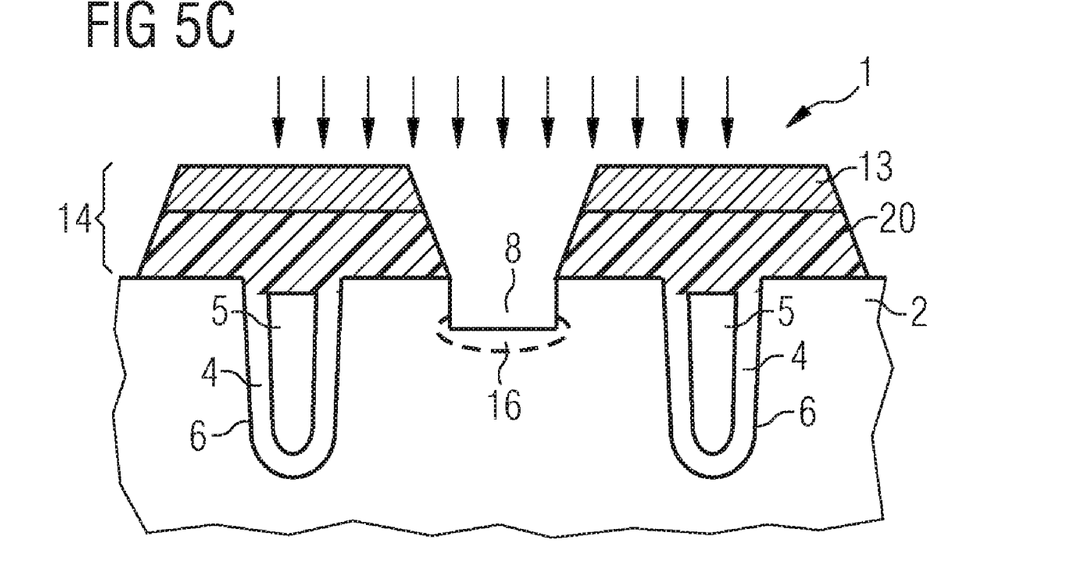

In the process stage illustrated schematically in FIG. 5C, dopants are implanted into the region 16 at the bottom of the contact trench 8. Here, too, the layer stack 14 acts as a mask for protecting the underlying regions of the semiconductor body 2 against the implantation of dopants.

Figure 5D:
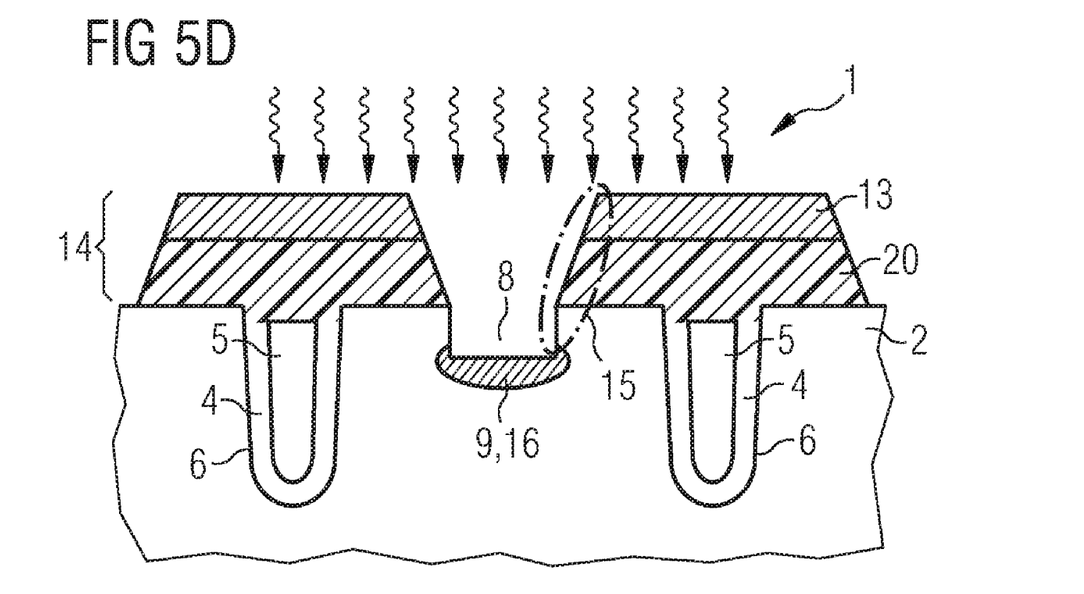

In the process stage illustrated as a schematic cross-sectional view in FIG. 5D, the topology process 15 is formed between the bottom region of the contact trench 8 and the surface of the polysilicon layer 13. The laser annealing in the melt mode then melts, on the one hand, the region 16 at the bottom of the contact trench 8, but on the other hand also a region of the polysilicon layer 13 which is near the surface. The polysilicon layer 13 protects the underlying regions of the semiconductor body 2 against likewise being melted during the laser annealing, whereby undesirable strains are avoided at the interface between semiconductor body 2/insulation structure 20. The topology process 15, i.e. its structural constituents, is maintained in process stages, wherein for instance a further conductive material, e.g., a contact plug composed of polysilicon, is deposited on the polysilicon layer 13 and also in the trench 8.

Figure 6A:
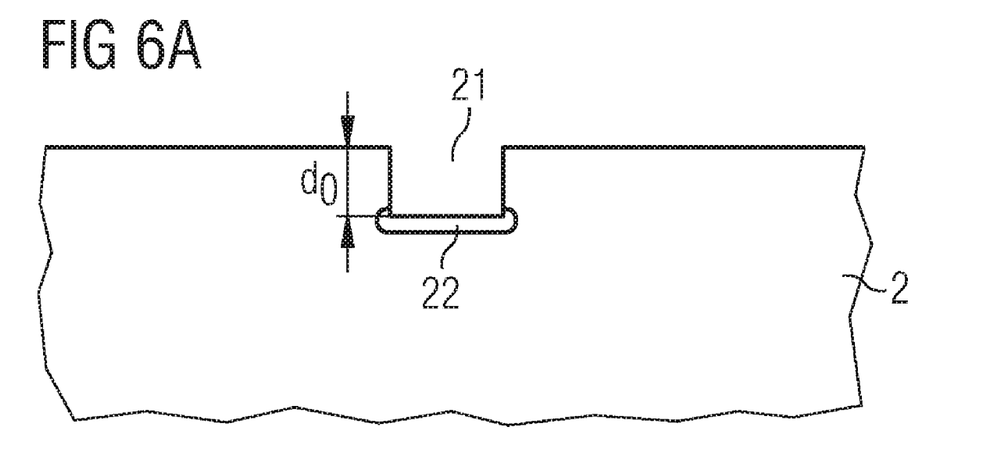
FIGS. 6A and 6B illustrate schematic cross-sectional views of a semiconductor body during the production of a semiconductor zone with a steep doping profile in accordance with a further embodiment of the invention.

FIG. 6A illustrates a schematic cross-sectional view during the production of a semiconductor zone 22 in accordance with one embodiment. In this case, the semiconductor zone 22 has dopants that have already been activated by laser annealing in the melt mode, and is formed in a lower region of a trench 21 having a topology process height d0. The process stage illustrated in FIG. 6A may correspond for example to the process stages illustrated in FIGS. 3F and 4D.

Figure 6B:
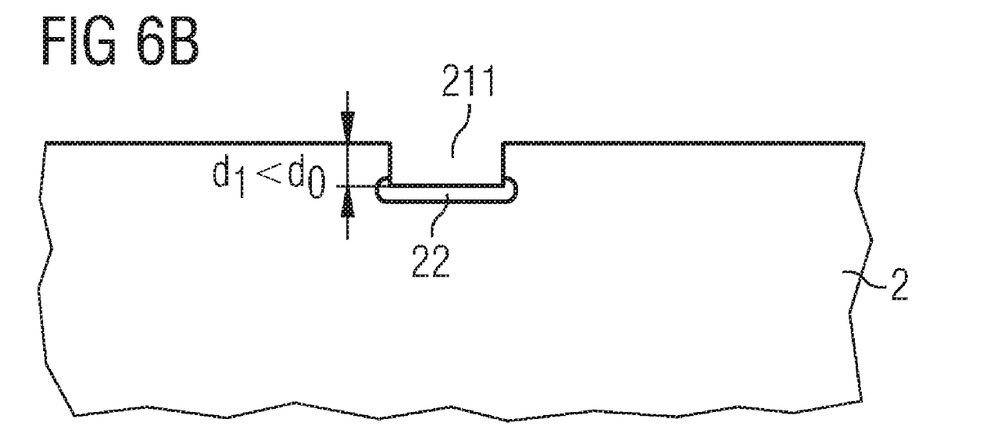

In one embodiment, the semiconductor body 2 is pulled back from the surface with the trench 21, with the result that a new trench 211 having a smaller topology process d1 is produced, i.e. d1<d0 (see FIG. 6B). The pull-back may be effected for example by chemical mechanical polishing or else by etching the semiconductor body 2 in conjunction with an application of suitable etching protective layers that is effected beforehand.

Figure 7A:
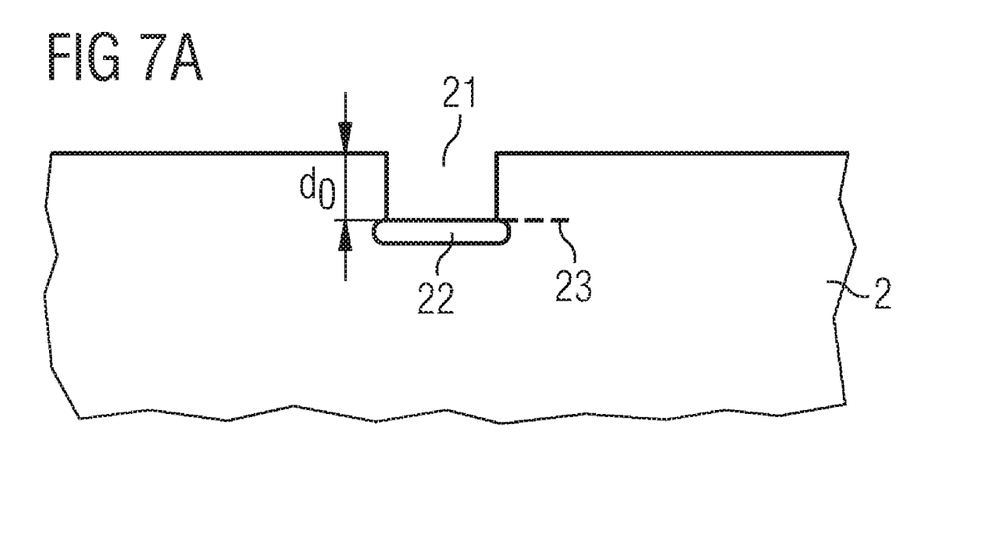
FIGS. 7A and 7B illustrate schematic cross-sectional views of a semiconductor body during the production of a semiconductor zone in accordance with a further embodiment of the invention.

FIG. 7A illustrates a schematic cross-sectional view of a semiconductor body 2 during the production of the semiconductor zone 22 in accordance with a further embodiment of the invention. The cross-sectional view illustrated in FIG. 7A corresponds to that of FIG. 6A, and so a renewed description thereof is dispensed with. A height level in the lower region of the topology process in the trench 21 is provided with the reference identification 23.

Figure 7B:
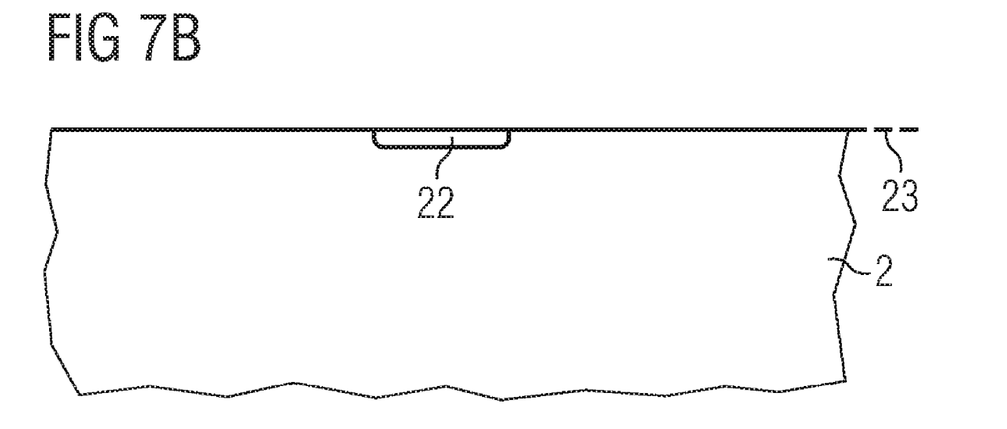

In one embodiment, the semiconductor body 2 is pulled back from the surface with the trench 21 as far as the height level 23 (see FIG. 7B). Consequently, the semiconductor body 2 is leveled, i.e. planarized, as far as the top side of the semiconductor zone 22. In this embodiment, too, the pull-back of the semiconductor body 2 may be effected by chemical mechanical polishing or etching.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making an integrated circuit comprising:
providing a semiconductor body;
implanting dopants into at least one partial region of the semiconductor body uncovered at a lower region of a topology process, wherein the uncovered partial region is below an upper surface of the semiconductor body,
irradiating the semiconductor body to activate the dopants, including protecting region laterally directly adjacent to the partial region; and
recrystallizing the partial region, to provide a semiconductor zone having a steep doping profile.

2. The method of claim 1, comprising:
providing the topology process at a surface of the semiconductor body.

3. The method of claim 1, comprising:
wherein irradiating the semiconductor body to activate the dopants includes melting at least the partial region of the semiconductor body.

4. The method of claim 1, comprising:
maintaining the at least one topology process in respect of its structural composition during subsequent processes.

5. The method of claim 1, comprising:
providing the topology process at a surface of the semiconductor body through an opening in a layer stack formed on the semiconductor body, wherein the opening reaches as far as the surface of the semiconductor body.

6. The method of claim 5, comprising wherein the opening projects into the semiconductor body.

7. The method of claim 5, wherein the layer stack comprises at least an insulation structure formed on the surface of the semiconductor body and an absorption structure formed on the insulation structure, wherein the absorption structure absorbs the laser radiation.

8. The method as claimed in claim 1, comprising providing the at least one topology process at the surface of the semiconductor body through a trench formed in the semiconductor body.

9. The method as claimed in claim 8, comprising wherein before the at least one topology process is provided, further dopants are implanted into the semiconductor body, with the result that the further dopants are introduced into the semiconductor body in the region of the at least one topology process to be formed and in a manner at least partly adjacent therefrom, and activating the further dopants by irradiating the semiconductor body with laser radiation before the at least one topology process is provided.

10. A method for producing a semiconductor having semiconductor zones with a steep doping profile, comprising:
providing a preprocessed semiconductor substrate, wherein the semiconductor substrate has a semiconductor body and also at least one topology process at a surface of the semiconductor substrate and dopants are implanted into at least one partial region of the semiconductor body that is uncovered in the lower region of the topology process wherein the uncovered partial region is below an upper surface of the semiconductor body,
irradiating the semiconductor body with laser radiation in order to activate the dopants by melting at least the partial region of the semiconductor body, wherein the partial region subsequently recrystallizes; and
maintaining the at least one topology process in respect of its structural composition during subsequent processes.

11. The method as claimed in claim 10, comprising providing the at least one topology process at the surface of the semiconductor substrate through an opening in a layer stack formed on the semiconductor body, wherein the opening reaches as far as the surface of the semiconductor body.

12. The method as claimed in claim 11, comprising wherein the opening projects into the semiconductor body.

13. The method as claimed in claim 11, wherein the layer stack comprises at least an insulation structure formed on the surface of the semiconductor body and an absorption structure formed on the insulation structure, wherein the absorption structure absorbs the laser radiation.

14. The method as claimed in claim 13, comprising forming the insulation structure as an oxide structure and/or nitride structure of the silicon and the absorption structure is formed from polysilicon.

15. The method as claimed in claim 14, comprising wherein the absorption structure has a thickness within the range of 100 to 500 nm.

16. The method as claimed in claim 11, comprising removing the layer stack again in the subsequent processes outside a region of influence of the topology process.

17. The method as claimed in claim 10, comprising providing the at least one topology process at the surface of the semiconductor body through a trench formed in the semiconductor body.

18. The method as claimed in claim 17, comprising wherein before the at least one topology process is provided, further dopants are implanted into the semiconductor body, with the result that the further dopants are introduced into the semiconductor body in the region of the at least one topology process to be formed and in a manner at least partly adjacent therefrom.

19. The method as claimed in claim 18, comprising activating the further dopants by irradiating the semiconductor body with laser radiation before the at least one topology process is provided.

20. The method as claimed in claim 17, comprising filling the trench forming the topology process with a conductive material.

21. The method as claimed in claim 17, comprising wherein after the irradiation with laser radiation, an oxide structure is formed within the trench and a contact structure is produced within the trench for making contact with the buried conductive layer formed in the partial region of the semiconductor body.

22. The method as claimed in claim 21, comprising forming further conductive materials which are electrically insulated from the buried conductive layer within the trench.

23. The method as claimed in claim 10, comprising wherein the laser irradiation is effected by a laser pulse whose absorption, in the semiconductor body results in the depositing of an energy density within the range of 1 to a few tens of $J/cm^2$.

24. A method for producing an integrated circuit with a semiconductor having semiconductor zones with a steep doping profile, comprising:
providing a preprocessed semiconductor substrate, wherein the semiconductor substrate has a semiconductor body and also at least one topology process provided at the surface of the semiconductor body by a trench formed in the semiconductor body, and
dopants are implanted into at least one partial region of the semiconductor body that is uncovered in the lower region of the topology process wherein the uncovered partial region is below an upper surface of the semiconductor body,
- irradiating the semiconductor body with laser radiation in order to activate the dopants by melting at least the uncovered partial region of the semiconductor body, wherein the partial region subsequently recrystallizes; and
- maintaining at least one part of the at least one topology process during subsequent processes.

25. A method for producing an integrated circuit with a semiconductor having semiconductor zones with a steep doping profile, comprising:
- providing a preprocessed semiconductor substrate, wherein the semiconductor substrate has a semiconductor body and also at least one topology process provided at the surface of the semiconductor body by a trench formed in the semiconductor body, and dopants are implanted into at least one partial region of the semiconductor body that is uncovered in the lower region of the topology process wherein the uncovered partial region is below an upper surface of the semiconductor body,
- irradiating the semiconductor body with laser radiation in order to activate the dopants by melting at least the uncovered partial region of the semiconductor body, wherein the partial region subsequently recrystallizes; and
- planarizing the semiconductor body as far as the partial region.

* * * * *